(12) United States Patent
Bayat et al.

(10) Patent No.: US 11,513,797 B2
(45) Date of Patent: Nov. 29, 2022

(54) SYSTEMS AND METHODS FOR ANALOG VECTOR BY MATRIX MULTIPLIER

(71) Applicant: MENTIUM TECHNOLOGIES INC., Santa Barbara, CA (US)

(72) Inventors: Farnood Merrikh Bayat, Goleta, CA (US); Mirko Prezioso, Goleta, CA (US)

(73) Assignee: MENTIUM TECHNOLOGIES INC., Santa Barbara, CA (US)

( * ) Notice: Subject to any disclaimer, the term of this patent is extended or adjusted under 35 U.S.C. 154(b) by 416 days.

(21) Appl. No.: 16/569,505

(22) Filed: Sep. 12, 2019

(65) Prior Publication Data
US 2020/0081711 A1    Mar. 12, 2020

Related U.S. Application Data

(60) Provisional application No. 62/730,498, filed on Sep. 12, 2018.

(51) Int. Cl.
| G06F 9/30 | (2018.01) |
| G06F 17/16 | (2006.01) |
| G06N 3/04 | (2006.01) |
| G11C 16/04 | (2006.01) |
| G11C 13/00 | (2006.01) |

(52) U.S. Cl.
CPC ........ G06F 9/3001 (2013.01); G06F 9/30036 (2013.01); G06F 9/30105 (2013.01); G06F 17/16 (2013.01); *G06N 3/04* (2013.01); *G11C 13/0002* (2013.01); *G11C 16/0408* (2013.01); *G11C 2213/71* (2013.01)

(58) Field of Classification Search
CPC ............... G06F 9/3001; G06F 9/30036; G06F 9/30105; G06F 17/16
See application file for complete search history.

(56) References Cited

U.S. PATENT DOCUMENTS

| 2017/0228345 A1* | 8/2017 | Gupta | G06N 3/0635 |
| 2020/0065660 A1* | 2/2020 | Tran | G06F 3/0688 |
| 2020/0066345 A1* | 2/2020 | Tran | G11C 16/10 |

* cited by examiner

*Primary Examiner* — Michael D. Yaary
(74) *Attorney, Agent, or Firm* — Maschoff Brennan

(57) ABSTRACT

A system may include a memory array for VMM and includes a matrix of devices. The devices may be configured to receive a programming signal to program a weight to store a matrix of weights. The devices may be configured to receive a digital signal representative of a vector of input bits. The devices may generate an analog output signal by individually multiplying input bits by a corresponding weight. The system may include multiple ADCs electrically coupled to a corresponding device. Each ADC may be configured to convert a corresponding analog output signal to a digital signal based on a current level of the corresponding analog output signal. The system may include registers electrically coupled to a corresponding ADC configured to shift and store an output vector of bits of a corresponding digital output signal based on an order of the vector of input bits received by the corresponding device.

19 Claims, 11 Drawing Sheets

SYSTEMS AND METHODS FOR ANALOG VECTOR BY MATRIX MULTIPLIER

CROSS-REFERENCE TO RELATED APPLICATION

This patent application claims the benefit of and priority to U.S. Provisional App. No. 62/730,498 filed Sep. 12, 2018 titled "ACCURATE AND HIGH-SPEED DIGITAL-INPUT-ANALOG-OUTPUT VECTOR-BY-MATRIX MULTIPLIER," which is incorporated in the present disclosure by reference in its entirety.

FIELD

The embodiments discussed in the present disclosure are related to systems and methods for analog vector by matrix multiplier.

BACKGROUND

Computing devices are important in many industries. Non-volatile memory is an important component of many computing devices. The speed at which data can be written to and read from memory is an important factor in the speed of many computing devices.

The subject matter claimed in the present disclosure is not limited to embodiments that solve any disadvantages or that operate only in environments such as those described above. Rather, this background is only provided to illustrate one example technology area where some embodiments described in the present disclosure may be practiced.

SUMMARY

One or more embodiments of the present disclosure may include a system. The system may include a memory array. The memory array may be configured to be used for vector by matrix multiplication (VMM). The memory array may include a matrix of devices. Each device of the matrix of devices may be configured to receive a sequence of programming signals or pulses. The programming signals may be used to program a weight of the corresponding device, which may cause the memory array to store a matrix of weights. Each device of the matrix of devices may also be configured to receive a digital input signal. The digital input signal may be representative of a vector of input bits. In addition, each device of the matrix of devices may be configured to generate an analog output signal. The analog output signal may be generated by individually multiplying each input bit of the vector of input bits by the weight programmed on the corresponding device. The system may also include multiple analog-to-digital converters (ADCs). Each ADC may be electrically coupled to a corresponding device. In addition, each ADC may be configured to convert a corresponding analog output signal to a digital output signal. The corresponding digital output signal may be converted based on a current level of the corresponding analog output signal. In addition, the system may include multiple registers electrically coupled to a corresponding ADC. Each of the registers may be configured to shift and store an output vector of bits of a corresponding digital output signal. The corresponding digital output signal may be shifted and stored based on an order of the vector of input bits received by the corresponding device.

The object and advantages of the embodiments will be realized and achieved at least by the elements, features, and combinations particularly pointed out in the claims. Both the foregoing general description and the following detailed description are exemplary and explanatory and are not restrictive.

BRIEF DESCRIPTION OF THE DRAWINGS

Example embodiments will be described and explained with additional specificity and detail through the use of the accompanying drawings in which.

DESCRIPTION OF EMBODIMENTS

Figure 1:
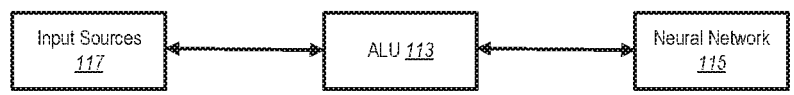
FIG. 1 illustrates an example environment in which an arithmetic logic unit (ALU) may be implemented.

In some embodiments, an ALU may include a memory array to perform vector-by-matrix multiplication (VMM). In some memory arrays, devices in the memory array may be weighted (e.g., programmed by applying a sequence of pulses to device terminals (gates, drain and source) with properly adjusted amplitude) with an analog signal. In VMM, a vector (e.g., an input vector) may be received as input by the memory array. The input vector may be multiplied by a matrix of synaptic weights (e.g., weights) stored on the devices in the memory array. In some VMM technologies, the input vector and/or the weights may be imported from an external memory (e.g., external to the memory array) into the memory array. Once in the ALU, the weights and the input vector may be used to perform VMM using the memory array. A result of the VMM may be used for additional processing such as in neural networks.

In some VMM technologies, accessing the external memory (e.g., external or internal to the ALU) may increase an amount of time to perform VMM. Additionally, in some VMM technologies, an analog neuromorphic architecture may be implemented to perform VMM. In these and other VMM technologies, the devices in the memory array may permanently store the weights in analog. In addition, in these and other VMM technologies, input vectors may be applied as analog signals. Further, in these and other VMM technologies, analog outputs may include the results of VMM. These and other VMM technologies may be inefficient and slow in performing VMM. In addition, these and other VMM technologies may increase a circuit footprint of the ALU by including a buffer for buffering input vectors.

According to various embodiments described in the present disclosure, the input vectors as digital signals may be applied directly to the memory array instead of analog signals. In addition, each bit of the digital signals may be multiplied by the weights stored on corresponding devices in the memory array. In some embodiments, the weights may be programmed using digital signals or analog signals. Digital output signals may be generated, and the digital output signals may be shifted by registers based on a corresponding bit location in the input vectors. The digital output signals may be shifted based on a number of bits in the input vector. For example, the digital output signal corresponding to the first bit of the input vector may be shifted a number of bits equal to a total number of bits in the input vector. As another example, the digital output signal corresponding to the third bit of the input vector may be shifted by a number of bits equal to the number of bits in the input vector minus three.

Some embodiments described in the present disclosure may permit data to be pipelined during VMM. For example, during VMM of a first bit, a second bit may be provided to a buffer to be provided to the memory array. Moreover, some embodiments described in the present disclosure may permit conversion performed by analog to digital converters (ADCs) to be pipelined with the memory array during VMM. For example, during conversion of the first analog output current to voltage, the second bit of the input vector may be provided to the array. In addition, some embodiments described in the present disclosure may reduce a circuit footprint since the buffer at the input may be for one bit rather than an entire input vector. Further, some embodiments described in the present disclosure may increase a speed for performing VMM since performing analog VMM with digital inputs is quicker than performing VMM with analog inputs.

In some embodiments, the memory array may include non-volatile memory device. For example, the memory array may include a flash memory device, a memristive memory device, a phase change memory (PCM) device, etc.

These and other embodiments of the present disclosure will be explained with reference to the accompanying figures. In the figures, features with like numbers indicate like structure and function unless described otherwise.

FIG. 1 illustrates an example environment 100 in which an ALU 113 may be implemented, in accordance with at least one embodiment described in the present disclosure. The environment 100 may include an input source 117, the ALU 113, and a neural network 115.

The ALU 113 may receive digital input signals representative of input vectors that include multiple bits from the input source 117. The ALU 113 may include a memory array (not illustrated in FIG. 1) that stores a matrix of weights. The memory array may include a flash memory array, a memristor memory array, or any other appropriate memory array. The memory array may multiply each input bit in the input vectors by corresponding weights. An output of the ALU 113 (e.g., a result of the VMM) may include the results of the VMM and may be provided to the neural network 115 for additional processing.

Figure 2A:
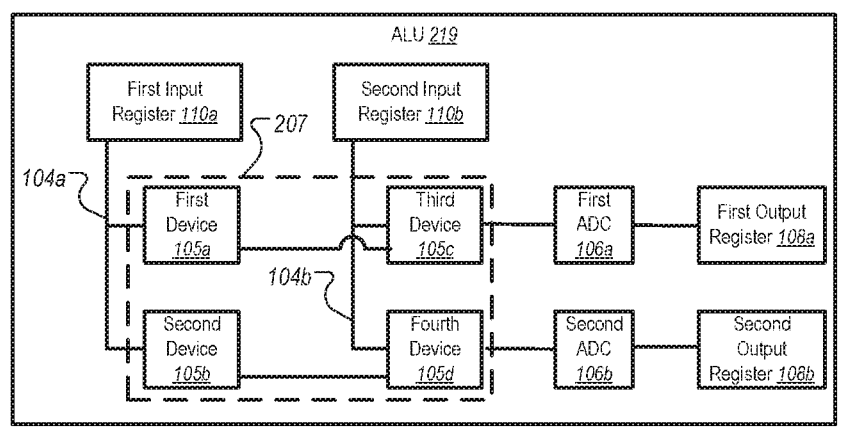
FIG. 2A illustrates an example ALU that may be implemented in the environment of FIG. 1.

FIG. 2A illustrates an example ALU 219 that may be implemented in the environment 100 of FIG. 1, in accordance with at least one embodiment described in the present disclosure. The ALU 219 may correspond to the ALU 113 of FIG. 1.

The ALU 219 may include one or more of a first input register 110a, a second input register 110b, a first ADC 106a, a second ADC 106b, a first output register 108a, and/or a second output register 108b. The ALU 219 may also include a memory array 207 that includes a first device 105a, a second device 105b, a third device 105c, and a fourth device 105d (referred to collectively as "devices 105" or individually as "device 105"). The illustration of four devices 105 is for illustrative purposes only. The memory array 207 may include any number of devices 105 in each row, for example, thousands or more devices 105. In addition, the memory array 207 may include a two-dimensional or three-dimensional matrix of devices 105.

The devices 105 may form a matrix configured to receive a sequence of programming pulses signals (e.g., programming signals) at device terminals (gates, drain and source) with properly adjusted amplitude to store a weight value corresponding to a number of electrons on a gate of the corresponding devices 105. In some embodiments, a device state (e.g., the weight of the devices 105) may be measured. If the device state is not within a target state, another programming pulse may be applied to the devices 105. In some embodiments, the weight value may include a positive value or a negative value. In addition, in some embodiments, the weight values stored on the devices 105 may include an analog value or a digital value. In some embodiments, the gate of the devices 105 may include a floating gate.

In some embodiments, the devices 105 may include transistors configured to store bits of data as a charge, for example, on floating gate transistors. The devices 105 may include single-level cell (SLC) devices. Additionally or alternatively, the devices 105 may include multi-level cell (MLC), triple-level cell (TLC) or quad-level cell (QLC) devices. In some embodiments, the memory array 207 may be used to perform neural network operations (e.g., the memory array 207 may be used in read mode to execute functionality of synapses of the neural network).

The devices 105 may be electrically coupled to the first input register 110a and the second input register 110b via a first input line 104a and a second input line 104b. The devices 105 may receive input vectors that include multiple bits via the first input line 104a and the second input line 104b. The number of bits included in the input vectors may include eight bits or any other appropriate number of bits.

In some embodiments, initial input bits received by the devices 105 may include a most significant bit of the input vectors. In these and other embodiments, each subsequent bit received by the devices 105 may decrease in significance. In other embodiments, the initial bits received by the devices 105 may include a least significant bit of the input vectors. In these and other embodiments, each subsequent bit received by the devices 105 may increase in significance.

An example of VMM being performed for a first input vector and a second input vector will now be discussed. The first input register 110a may provide the first input vector to the first device 105a and the second device 105b via the first input line 104a. In addition, the second input register 110b may provide the second input vector to the third device 105c and the fourth device 105d via the second input line 104b. The first device 105a may store a first weight value and the second device 105b may store a second weight value. Further, the third device 105c may store a third weight value and the fourth device 105d may store a fourth weight value.

The first device 105a and the second device 105b may receive a first input bit of the first input vector. The first device 105a and the second device 105b may multiply the first input bit of the first input vector by the corresponding weight values. For example, the first device 105a may multiply the first input bit of the first input vector by the first weight value and the second device 105b may multiply the first input bit of the first input vector by the second weight value.

The third device 105c and the fourth device 105d may receive a first input bit of the second input vector. The third device 105c and the fourth device 105d may multiply the first input bit of the second input vector by the corresponding weight values. For example, the third device 105c may multiply the first input bit of the second input vector by the third weight value and the fourth device 105d may multiply the first input bit of the second input vector by the fourth weight value.

The first ADC 106a may receive a first intermediate signal that is a sum of the multiplication performed by the first device 105a and the third device 105c. For example, the first intermediate signal may be representative of the sum of the multiplication of the first input bit of the first input vector by the first weight value and the first input bit of the second input vector by the third weight value. In addition, the second ADC 106b may receive a second intermediate signal that is a sum of the multiplication performed by the second device 105b and the fourth device 105d. For example, the second intermediate signal may be representative of the sum of the multiplication of the first input bit of the first input vector by the second weight value and the first input bit of the second input vector by the fourth weight value. The first and second intermediate signals may be analog signals.

The first ADC 106a may convert the first intermediate signal to a first digital signal. In some embodiments, the first ADC 106a may convert the first intermediate signal to the first digital signal based on a current level of the first intermediate signal. Similarly, the second ADC 106b may convert the second intermediate signal to a second digital signal. The first and second digital signals may be a single bit or multi-bit value.

The output registers 108 may receive and shift the digital signal based on a bit location of the input bit of the input vectors. For example, if the first digital signals are representative of most significant bits (MSB) of the input vectors, the output registers 108 may shift the first digital signals one bit to the left (e.g., may increase a significance and a value of the first digital signals in the output registers 108).

In some embodiments, the first output register 108a and the second output register 108b may shift the first digital signal and the second digital signal, respectively, by multiplying each signal by a signal equivalent to two to the Nth power where N is equal is to a total number of input bits in the input vectors.

This process may be repeated for each input bit included in the first and second input vectors. In subsequent calculations, the first output register 108a and the second output register 108b may multiply corresponding digital signals by a signal representative of two the Nth power minus a current bit location. Each subsequent calculation may be added to an end of previous results in the first output register 108a and the second output register 108b to generate output vectors that includes a number of bits equivalent, lower or greater to the number of input bits in the first input vector or the second input vector.

In some embodiments, the first output register 108a and the second output register 108b may shift corresponding signals while the first ADC 106a and the second ADC 106b are simultaneously converting subsequent intermediate signals. Simultaneous operation of the first ADC 106a, the second ADC 106b, the first output register 108a, and/or the second output register 108b may reduce an amount of time used to perform VMM by the ALU 219.

In some embodiments, resolution of later digital signals (e.g., a least significant (LSB)) may be decreased and still provide acceptable results. For example, the resolution of operations performed for the MSB of an eight-bit vector may be eight bits and the resolution of operations performed for the MSB minus four bits of an eight-bit vector may be four bits.

In some embodiments, the devices 105 may properly function only with input vectors that include positive values. In other embodiments, the devices 105 may properly function with input vectors that include both positive and negative values. In these and other embodiments, negative weight values may be applied to a portion of the devices 105.

In some embodiments, the devices 105 may properly function only with weight values that are nonnegative values. In these and other embodiments, if a weight value to be programmed is negative, each of the weight values may be shifted by a value such that each weight value becomes a nonnegative value. For example, if a weight value for the first device 105a is negative one and the weight value for the third device 105c is positive one, each weight value may be shifted by one to cause each weight value to be nonnegative (e.g., negative one becomes zero and positive one becomes positive two). In some other embodiments, if a weight value to be programmed is negative, each of the weight values may be implemented with two devices 105 each programmed with positive values. In these and other embodiments, to have a correct output result, the first and second output registers 110a, 110b may be subtracted from one another after all the input bits of the input vectors are applied to the memory array 107.

In some embodiments, a sum of the input vectors may be determined and subtracted from the output vectors. This operation may shift the output vectors back down by a value equivalent to the amount the weight values were shifted (e.g., the output vectors may be shifted by one in the negative direction). In these and other embodiments, the memory array 207 may include half as many devices 105 compared to memory arrays that accept positive and negative weights.

In addition, if the weights of a portion of corresponding devices 105 are expected to be negative and another portion are expected to be positive, the weights may be applied as positive weights and a final output signal may be equivalent to a subtraction of two positive weights. For example, if a first row of the devices 105 are expected to be positive weights and a second row of the devices 105 are expected to be negative, the first row and the second row of the devices 105 may be programmed with the shifted positive weights. A second digital signal (e.g., the digital signal stored in the output registers 108 from the second row of the devices 105) may be subtracted from a first digital signal (e.g., the digital signal stored in the output registers 108 from the first row of the devices 105) to obtain a final digital signal that is the same as or similar to the digital signal if both positive and negative weights were to have been used.

In addition, in some embodiments, the input signals may be applied to any appropriate terminal of the devices 105. For example, the input signals may be applied to the drain, the source, or the gates of the devices 105 as is discussed in more detail below.

Modifications, additions, or omissions may be made to FIG. 2A without departing from the scope of the present disclosure. For example, the ALU 219 may include more or fewer elements than those illustrated and described in the present disclosure. Moreover, in some embodiments, the ALU 219 may include three or more input registers 110, ADCs 106, and/or output registers 108.

Figure 2B:
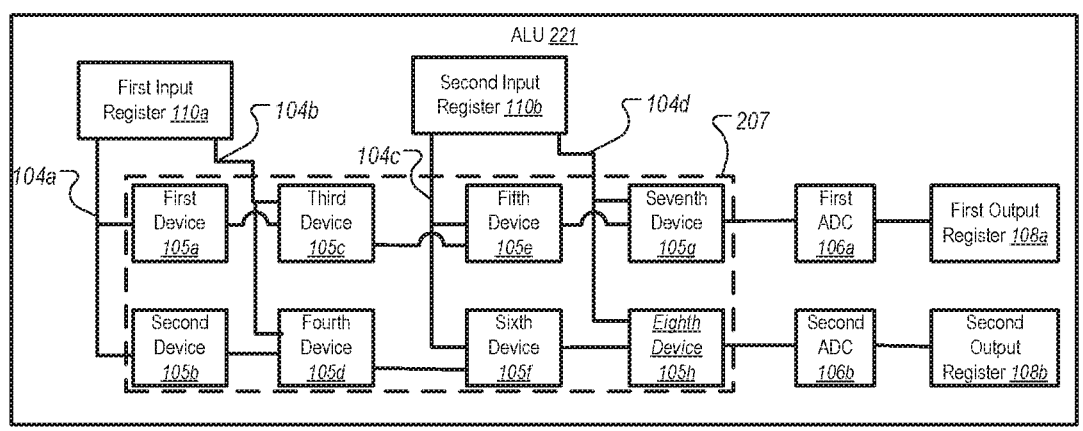
FIG. 2B illustrates another example ALU that may be implemented in the environment of FIG. 1.

FIG. 2B illustrates another example ALU 221 that may be implemented in the environment 100 of FIG. 1, in accordance with at least one embodiment described in the present disclosure. The ALU 221 may correspond to the ALU 113 of FIG. 1. The ALU 221 may operate similar to the ALU 219 of FIG. 2A but two input bits of the input vectors may be calculated simultaneously. The two input bits being multiplied simultaneously may be of adjacent significance to each other (e.g., two adjacent input bits may be provided to two adjacent columns of devices 105).

An example of VMM being performed for the first input vector and the second input vector will now be discussed. In some embodiments, the first input register 110*a* may provide the first input vector to the first device 105*a* and the second device 105*b*. In these embodiments, the first input register 110*a* may provide the first input vector to the third device 105*c* and the fourth device 105*d*. In some embodiments, the second input register 110*b* may provide the second input vector to a fifth device 105*e* and a sixth device 105*f* via a third input line 104*c*. In addition, in these and other embodiments, the second input register 110*b* may provide the second input vector to a seventh device 105*g* and an eighth device 105*h* via a fourth input line 104*d*.

The first device 105*a* and the second device 105*b* may receive the first input bit of the first input vector. Similarly, the third device 105*c* and the fourth device 105*d* may receive a second input bit of the first input vector. The first device 105*a* and the second device 105*b* may multiply the first input bit of the first input vector by the corresponding weight values. In addition, the third device 105*c* and the fourth device 105*d* may multiply the second input bit of the first input vector by the corresponding weight values.

The fifth device 105*e* and the sixth device 105*f* may receive the first input bit of the second input vector. Similarly, the seventh device 105*g* and the eighth device 105*h* may receive a second input bit of the second input vector. The fifth device 105*e* and the sixth device 105*f* may multiply the first input bit of the second input vector by the corresponding weight values. In addition, the seventh device 105*g* and the eighth device 105*h* may multiply the second input bit of the second input vector by the corresponding weight values.

The first ADC 106*a* may receive the first intermediate signal that is a sum of the multiplication performed by the first device 105*a*, the third device 105*c*, the fifth device 105*e*, and the seventh device 105*g*. For example, the first intermediate signal may be representative of the sum of the multiplication of the first input bit of the first input vector by the first weight value, second input bit by the third weight value and the sum of the first input bit of the second input vector by the fifth weight value and second input bit by the seventh weight value. In addition, the second ADC 106*b* may receive the second intermediate signal that is a sum of the multiplication performed by the second device 105*b*, the fourth device 105*d*, the sixth device 105*f*, and the eighth device 105*h*. For example, the second intermediate signal may be representative of the sum of the multiplication of the first input bit of the first input vector by the second weight value, second input bit by the fourth weight value, and the sum of the first input bit of the second input vector by the sixth weight value and the second input bit by the seventh weight value.

The output registers 108 may receive and shift the first digital signal based on a bit location of the first input bit and the second input bit of the input vectors. For example, if the first digital signal is representative of the MSB and the MSB minus one of the input vectors, the output registers 108 may shift the first digital signal two bits to the left (e.g., may increase a significance and a value of the first digital signal in the output registers 108 by two spots).

This process may be repeated for each input bit included in the first and second input vectors. In subsequent calculations, the first output register 108*a* and the second output register 108*b* may not shift the digital signals.

In some embodiments, simultaneously multiplying two input bits may cause a circuit footprint of the ALU 221 to increase compared to the ALU 219 of FIG. 2A. In contrast, the ALU 221 may be capable of performing VMM twice as fast as the ALU 219 of FIG. 2A.

Modifications, additions, or omissions may be made to FIG. 2B without departing from the scope of the present disclosure. For example, the ALU 221 may include more or fewer elements than those illustrated and described in the present disclosure. Moreover, in some embodiments, the ALU 221 may include three or more input registers 110, ADCs 106, and/or output registers 108.

Figure 3A:
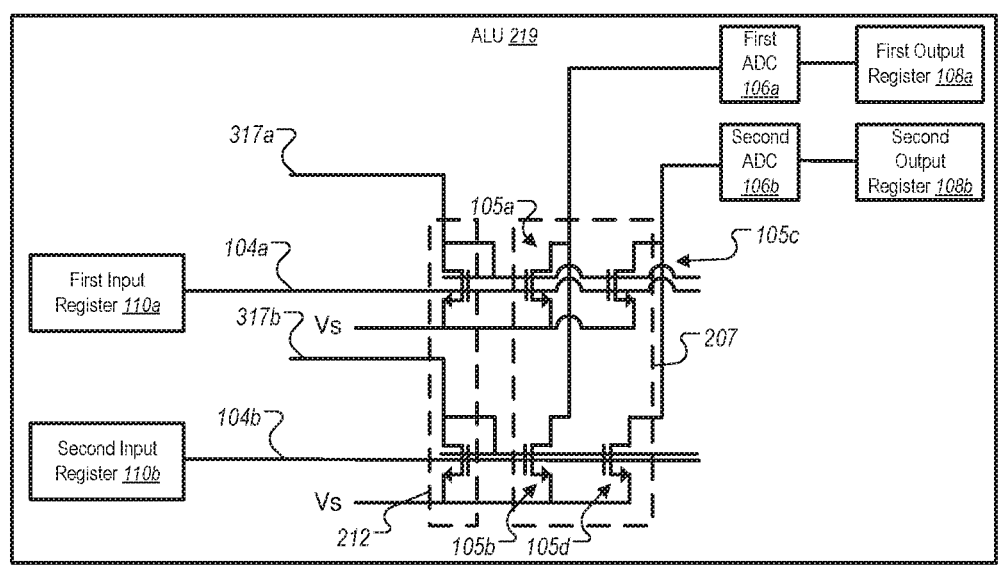
FIG. 3A illustrates an example detail view of the ALU of FIG. 2A.

FIG. 3A illustrates an example detail view of the ALU 219 of FIG. 2A, in accordance with at least one embodiment described in the present disclosure. The ALU 219 may correspond to the ALU 113 of FIG. 1.

The ALU 219 may include a mirror circuit 212. The mirror circuit 212 may compensate for temperature changes that occur in the ALU 219. For example, a voltage on a control gate line of the devices 105 may vary based on the temperature of the ALU 219. As another example, a voltage on a word line of the devices 105 may vary based on the temperature of the ALU 219. A first transistor in the mirror circuit 212 may convert the input current forced to a drain of the first transistor into voltage linearly or nonlinearly and a second transistor in the memory array 207 to produce a current proportional to the converted voltage. In some embodiments, the current mirrors may be P-type metal-oxide-semiconductor (PMOS) or N-type metal-oxide-semiconductor (NMOS) current mirrors. In some other embodiments, the current mirror may be implemented with the same transistors (e.g., the devices 105) in the memory array 207.

In some embodiments, a voltage may be applied to the word line or the control gate of devices (e.g., transistors) of the devices 105 in the memory array 207 to compensate for temperature of the ALU 219. One or more devices (e.g., flash transistors) in the mirror circuit 212 may be implemented in a reverse configuration (e.g., a diode connected configuration in which the gates are connected to the bit lines or drains). A fixed current may be applied to the devices in the mirror circuit 212. In some embodiments, the fixed current may be less than, greater than, or equal to one hundred nanoamps. As temperature in the ALU 219 changes, a voltage on the gates of the devices in the mirror circuit 212 will also change. The changing voltages may bias the devices 105 within the memory array 207. As the bias voltages change with the temperature, the devices 105 within the memory may be biased differently and may be temperature insensitive.

Each of the devices 105 may include a transistor that includes a gate, a drain, and a source. The gates of the devices 105 may include two inputs. One of the inputs may be electrically coupled to a word line and the other input may be electrically coupled to a control gate line. In some embodiments, the first input register 110*a* and the second input register 110*b* may be electrically coupled to the word lines and the control gate lines may be biased with a fixed voltage or through the mirror circuit. In other embodiments, the first input register 110a and the second input register 110b may be electrically coupled to the control gate line and the word line may be biased with a fixed voltage or through the mirror circuit (not illustrated in FIG. 3A). In some embodiments, the memory array 207 may include a flash device that apply inputs to source lines or bit lines in place of the control gate lines and/or word lines.

A first input node 317a and a second input node 317b may be provided a current to bias the devices in the mirror circuit 212. In some embodiments, the current to bias the devices 105 may be equal to, less than, or greater than one hundred nanoamps. In these and other embodiments, each of the devices 105 may be designed to propagate current within a range and the bias current may be within this range. For example, the range may be between zero and 100 nanoamps. Each source of the devices 105 may receive a voltage. In some embodiments, the voltage may be equal to zero volts. A total current on the drains of the devices 105 may be summed and equal to the VMM results.

In some embodiments, if the weights of a portion of corresponding devices 105 are expected to be negative and another portion are expected to be positive, the weights may be applied as positive weights and a final output signal may be equivalent to a subtraction of two positive output registers as discussed elsewhere in the present disclosure.

FIG. 3A illustrates an embodiment of the memory array 207 with the input signals being applied to the gates and the output signal being received via the drains of the devices 105. In other embodiments, the memory array 207 may be implemented with the input signals being applied to the drains or the sources of the devices 105 and the output signals may be received via the sources or the drains of the devices 105.

Modifications, additions, or omissions may be made to FIG. 3A without departing from the scope of the present disclosure. For example, the ALU 219 may include more or fewer elements than those illustrated and described in the present disclosure. Moreover, in some embodiments, the ALU 219 may include three or more input registers 110, ADCs 106, and/or output registers 108.

Figure 3B:
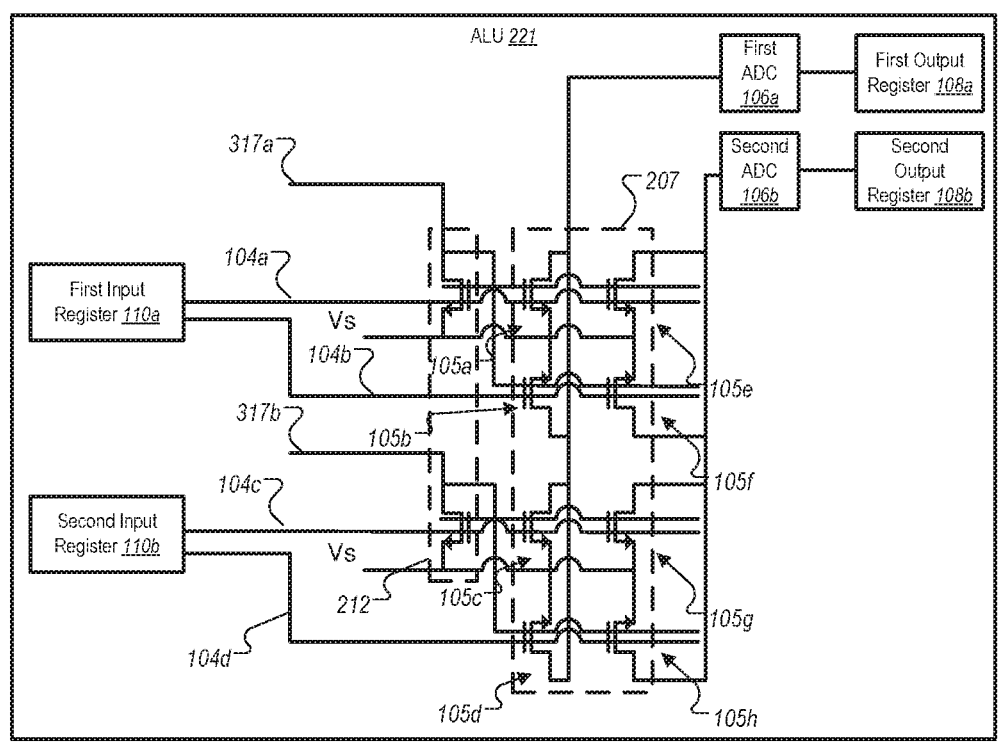
FIG. 3B illustrates an example detail view of the ALU of FIG. 2B.

FIG. 3B illustrates an example detail view of the ALU 221 of FIG. 2B, in accordance with at least one embodiment described in the present disclosure. The ALU 221 may correspond to the ALU 113 of FIG. 1. The ALU 221 may include the mirror circuit 212 to compensate for temperature changes that occur the ALU 221.

Each of the devices 105 may include a transistor that includes a gate, a drain, and a source. The gates of the devices 105 may include two inputs. One of the inputs may be electrically coupled to the word line and the other input may be electrically coupled to the control gate line. In some embodiments, the first input register 110a and the second input register 110b may be electrically coupled to the word lines and the control gate lines may be biased with fixed voltage or through the mirror circuit. In other embodiments, the first input register 110a and the second input register 110b may be electrically coupled to the control gate line and the word line may be biased with fixed voltage or through the mirror circuit (not illustrated in FIG. 3A). In some embodiments, the memory array 207 may include a flash device that includes source lines and bit lines in place of the control gate lines and word lines.

A first input node 317a and a second input node 317b may be provided a current to bias the devices 105. In some embodiments, the current to bias the devices 105 may be equal to, less than, or greater than one hundred nanoamps. Each source of the devices 105 may receive a voltage. In some embodiments, the voltage may be equal to zero volts. A total current on the drains of the devices 105 may be summed and equal to the VMM results.

The ALU 221 may be configured for simultaneous multiplication of input bits as discussed above in relation to FIG. 2B. In some embodiments, devices (e.g., transistors) in the mirror circuit 212 may be electrically coupled to two or more rows of the devices 105 in the memory array 207. In these and other embodiments, the devices in the mirror circuit 212 may be electrically coupled to two or more rows of the devices 105 in the memory array 207 that receive adjacent input bits from the input signals. Alternatively, the devices in the mirror circuit 212 may be electrically coupled to two or more rows of the devices 105 in the memory array 207 that may or may not receive adjacent input bits from the input signals.

FIG. 3B illustrates an embodiment of the memory array 207 with the input signals being applied to the gates and the output signal being received via the drains of the devices 105. In other embodiments, the memory array 207 may be implemented with the input signals being applied to the drains or the sources of the devices 105 and the output signals may be received via the sources or the drains of the devices 105.

Modifications, additions, or omissions may be made to FIG. 3B without departing from the scope of the present disclosure. For example, the ALU 221 may include more or fewer elements than those illustrated and described in the present disclosure. Moreover, in some embodiments, the ALU 221 may include three or more input registers 110, ADCs 106, and/or output registers 108.

Figure 4A:
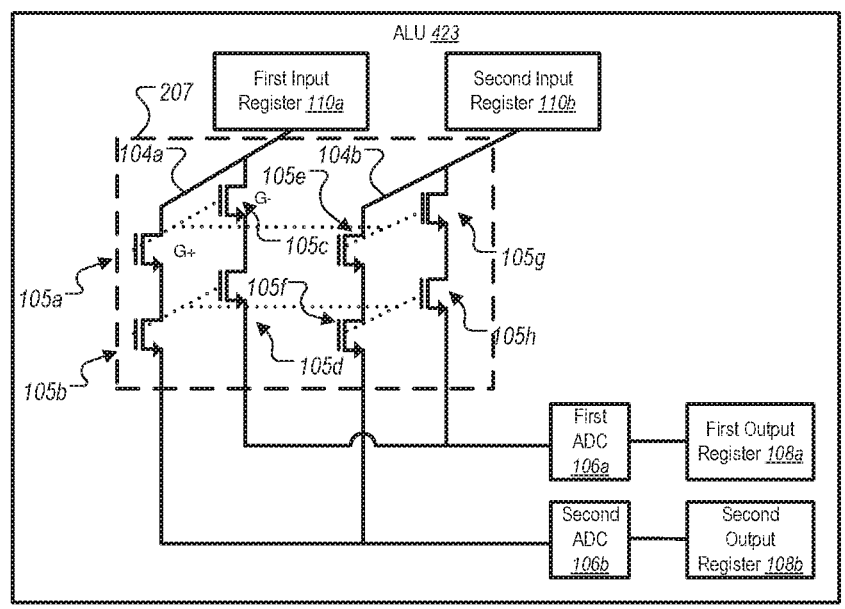
FIG. 4A illustrates another example ALU that may be implemented in the environment of FIG. 1.

FIG. 4A illustrates another example ALU 423 that may be implemented in the environment 100 of FIG. 1, in accordance with at least one embodiment described in the present disclosure. The ALU 423 may correspond to the ALU 113 of FIG. 1.

In some embodiments, the ALU 423 may include a three-dimensional memory matrix. The three-dimensional memory matrix may include a three-dimensional matrix of devices 105 that store a three-dimensional matrix of weights.

As illustrated in FIG. 4A, each gate in a three-dimensional row may be electrically coupled to each other via an electrical wires or plane. In some embodiment, each gate in a three-dimensional column may be electrically coupled to each other via an electrical wire or plane. The three-dimensional matrix may permit implementing larger VMMs in smaller area to be achieved. However, the three-dimensional matrix may decrease the speed for performing VMM due to the increased density of devices 105.

VMM may be performed layer by layer. For example, VMM may first be performed for a first horizontal layer (e.g., devices 105a, 105c, 105e, and 105g) and subsequently a second horizontal layer (e.g., devices 105b, 105d, 105f, and 105h). If a device 105 is not to be used for performing VMM, a high voltage may be applied to each gate in the horizontal layer. In some embodiments, the high voltage may be equal to or greater than two volts.

In some embodiments, the first input register 110a and the second input register 110b may be electrically coupled to drains of the devices 105 via input lines 104a and 104b correspondingly. In these and other embodiments, the first ADC 106a and the second ADC 106b may be electrically coupled to corresponding sources of the devices 105 perpendicular to a direction of the drains.

FIG. 4A illustrates an embodiment of the memory array 207 with the input signals being applied to the drains and the output signal being received via the sources of the devices 105. In other embodiments, the memory array 207 may be implemented with the input signals being applied to the gates or the sources of the devices 105 and the output signals may be received via the drains or the sources of the devices 105.

Modifications, additions, or omissions may be made to FIG. 4A without departing from the scope of the present disclosure. For example, the ALU 423 may include more or fewer elements than those illustrated and described in the present disclosure. Moreover, in some embodiments, the ALU 423 may include three or more input registers 110, ADCs 106, and/or output registers 108.

Figure 4B:
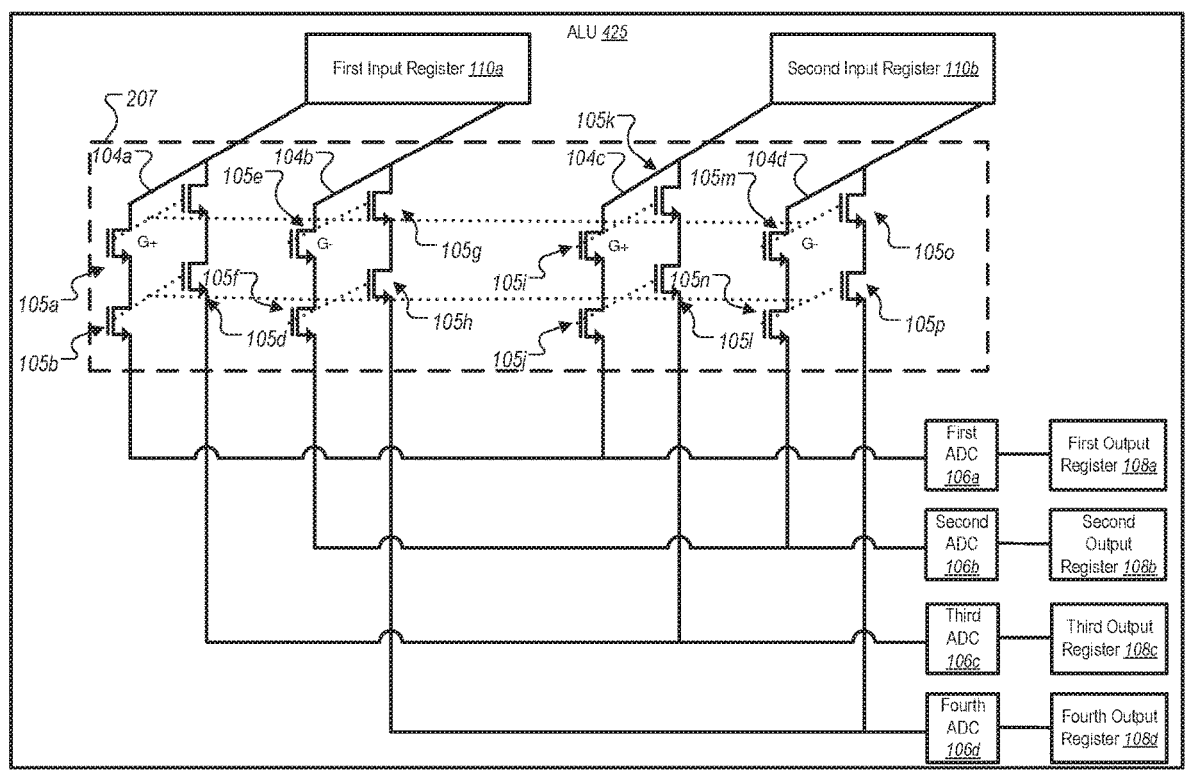
FIG. 4B illustrates yet another example ALU that may be implemented in the environment of FIG. 1.

FIG. 4B illustrates yet another example ALU 425 that may be implemented in the environment 100 of FIG. 1, in accordance with at least one embodiment described in the present disclosure. The ALU 425 may correspond to the ALU 113 of FIG. 1.

In some embodiments, the ALU 425 may include a three-dimensional memory matrix. The three-dimensional memory matrix may include a three-dimensional matrix of devices 105 that store a three-dimensional matrix of weights.

As illustrated in FIG. 4B, each gate in a three-dimensional row may be electrically coupled to each other via an electrical plane. The memory array 207 illustrated in FIG. 4B may perform VMM vertical layer by layer. For example, VMM may first be performed for a first vertical layer (e.g., devices 105*a*, 105*b*, 105*e*, 105*f*, 105*i*, 105*j*, 105*m*, and 105*n*) and subsequently a second vertical layer (e.g., devices 105*c*, 105*d*, 105*g*, 105*h*, 105*k*, 105*l*, 105*o*, and 105*p*). If a layer is not to be used for performing VMM, the high voltage may be applied to the corresponding gate plane or wires.

In some embodiments, output currents of the memory array 207 may be measured at each output, converted to digital (via the ADCs 106), and then have two adjacent outputs subtracted in digital to generate positive and negative weights.

In this and some other embodiments described in the present disclosure, the two positive weights representing a single negative weight may be implemented in devices 105 located within the three-dimensional memory array 207 next to each other in the x direction. In other embodiments, these two devices 105 may be located next to each other along the y axis of the memory array 207. In any of these cases, input bits may be applied to drains of the devices 105 in such a way that both of the devices 105 see the same input.

FIG. 4B illustrates an embodiment of the memory array 207 with the input signals being applied to the drains and the output signal being received via the sources of the devices 105. In other embodiments, the memory array 207 may be implemented with the input signals being applied to the gates or the sources of the devices 105 and the output signals may be received via the drains or the sources of the devices 105.

Modifications, additions, or omissions may be made to FIG. 4B without departing from the scope of the present disclosure. For example, the ALU 425 may include more or fewer elements than those illustrated and described in the present disclosure. Moreover, in some embodiments, the ALU 425 may include three or more input registers 110, ADCs 106, and/or registers 108.

Figure 5A:
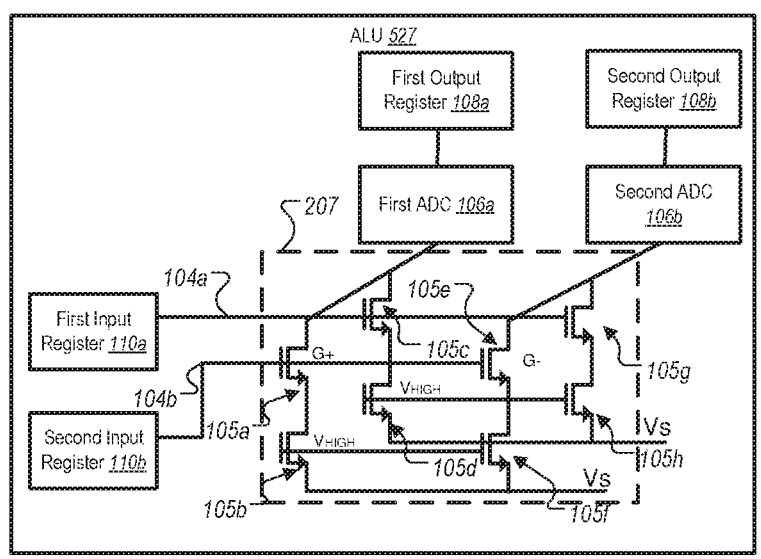
FIG. 5A illustrates an example ALU that may be implemented in the environment of FIG. 1.

FIG. 5A illustrates an example ALU 527 that may be implemented in the environment 100 of FIG. 1, in accordance with at least one embodiment described in the present disclosure. The ALU 527 may correspond to the ALU 113 of FIG. 1.

As illustrated in FIG. 5A, control gate lines of the devices 105 may be electrically coupled as lines (e.g., the control gate line of each device 105 in a row is electrically coupled to each other but not to devices 105 in other rows or three-dimensional rows). In some embodiments, bit lines and source lines of the transistors may be swapped.

In some embodiments, the first input register 110*a* and the second input register 110*b* may be electrically coupled to corresponding gates of the devices 105 in a layer where VMM is executed. Gates of other layers may be biased with high voltages. In these and other embodiments, the first ADC 106*a* and the second ADC 106*b* may be electrically coupled to corresponding drains of the devices 105. In some embodiments, VMM may be performed layer by layer as discussed elsewhere in the present disclosure. In these and other embodiments, multiple adjacent input bits of the input vectors may be simultaneously multiplied as also discussed elsewhere in the present disclosure. In these and other embodiments, the direction of drains lines may be perpendicular to the direction of gate lines. In addition, the sources of the devices 105 may be biased with fixed voltages as discussed elsewhere in the present disclosure.

FIG. 5A illustrates an embodiment of the memory array 207 with the input signals being applied to the gates and the output signal being received via the drains of the devices 105. In other embodiments, the memory array 207 may be implemented with the input signals being applied to the drains or the sources of the devices 105 and the output signals may be received via the sources or the drains of the devices 105.

Modifications, additions, or omissions may be made to FIG. 5A without departing from the scope of the present disclosure. For example, the ALU 527 may include more or fewer elements than those illustrated and described in the present disclosure. Moreover, in some embodiments, the ALU 527 may include three or more input registers 110, ADCs 106, and/or output registers 108.

Figure 5B:
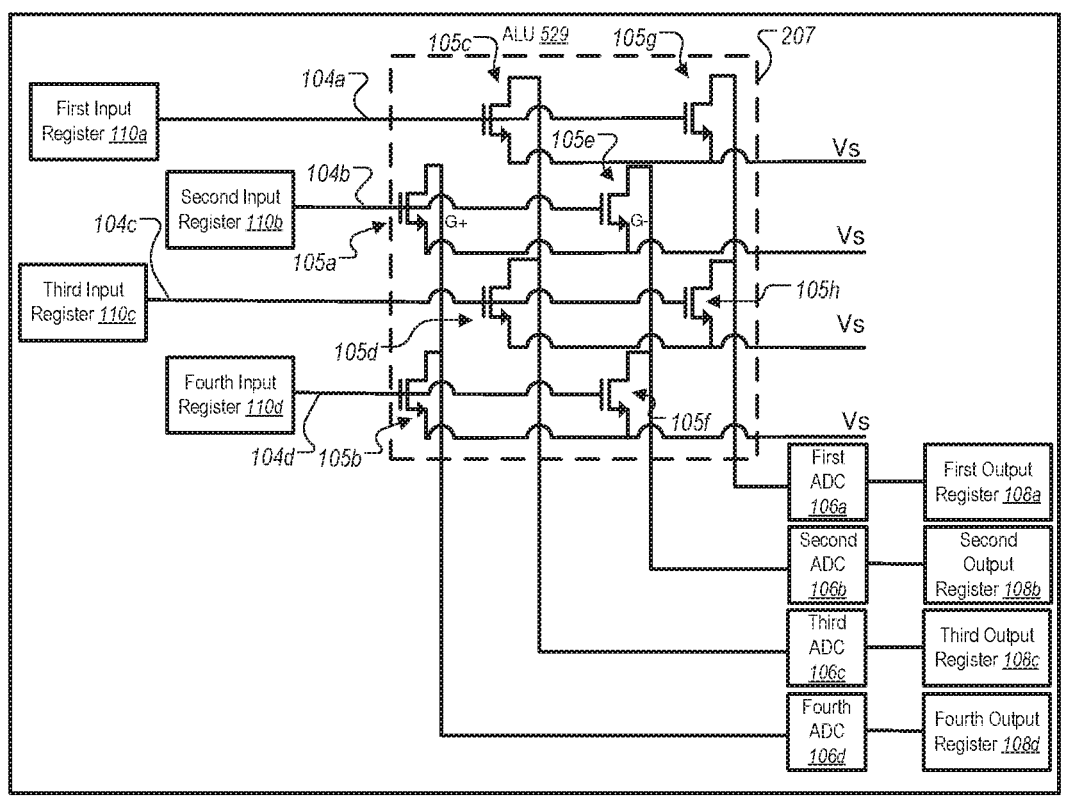
FIG. 5B illustrates another example ALU that may be implemented in the environment of FIG. 1.

FIG. 5B illustrates another example ALU 529 that may be implemented in the environment 100 of FIG. 1, in accordance with at least one embodiment described in the present disclosure. The ALU 529 may correspond to the ALU 113 of FIG. 1.

In some embodiments, the memory array 207 of the ALU 529 may include a three-dimensional NOR matrix. In some embodiments, if a voltage is being applied to a particular terminal of a devices 105 in a specific layer is a fixed voltage, those terminals of the devices 105 may be electrically coupled via either a plane or a line.

VMM may be performed layer by layer along the y direction. For example, VMM may first be performed for a first vertical layer (e.g., devices 105*a*, 105*b*, 105*e*, and 105*f* are connected serially in a Z direction (into the figure) through the drains of the devices 105) and subsequently a second vertical layer (e.g., devices 105*c*, 105*d*, 105*g*, and 10-5*h*). If a device 105 is not to be used for performing VMM, a low voltage may be applied to each gate in the vertical layer. In some embodiments, the low voltage may be equal to or lower than two volts. One or more devices may be shut off by providing a low voltage to their bit line. (e.g., the voltage applied to the source line to the corresponding drain). In some embodiments, the source line may be electrically coupled to the ADCs 106. In other embodiments, the source line may be used to shut corresponding devices 105 off and the drains may be electrically coupled to the ADCs 106.

FIG. 5B illustrates an embodiment of the memory array 207 with the input signals being applied to the gates and the output signal being received via the drains of the devices 105. In other embodiments, the memory array 207 may be implemented with the input signals being applied to the drains or the sources of the devices 105 and the output signals may be received via the sources or the drains of the devices 105.

Modifications, additions, or omissions may be made to FIG. 5B without departing from the scope of the present disclosure. For example, the ALU 529 may include more or fewer elements than those illustrated and described in the present disclosure. Moreover, in some embodiments, the ALU 529 may include three or more input registers 110, ADCs 106, and/or registers 108.

Figure 5C:
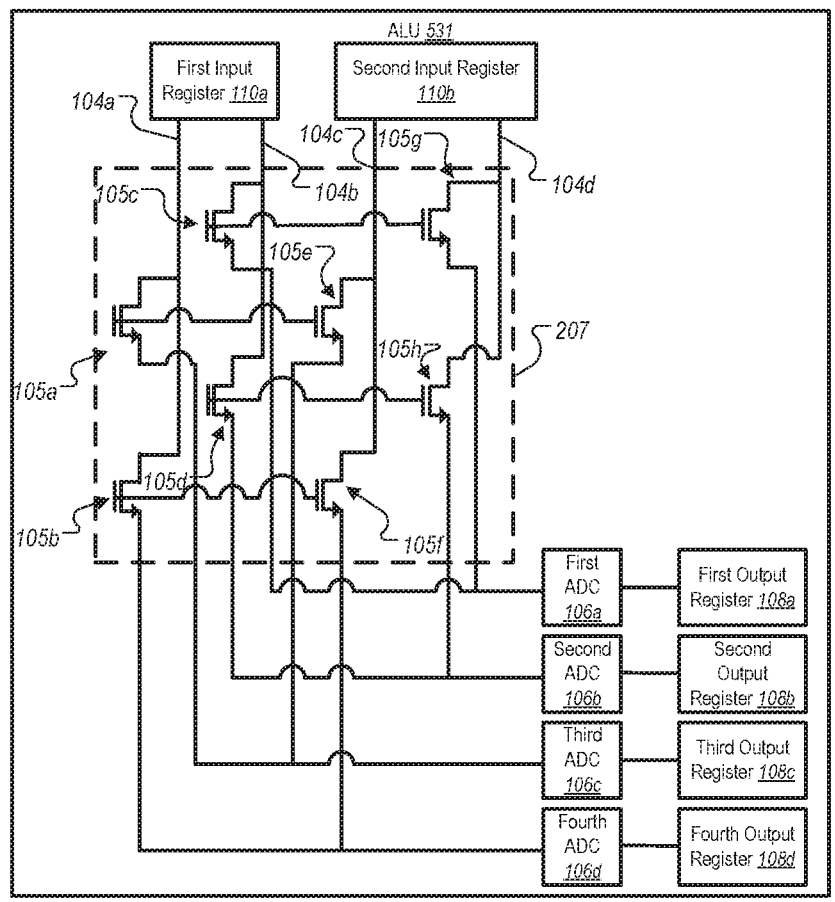
FIG. 5C illustrates yet another example ALU that may be implemented in the environment of FIG. 1.

FIG. 5C illustrates yet another example ALU 531 that may be implemented in the environment 100 of FIG. 1, in accordance with at least one embodiment described in the present disclosure. The ALU 531 may correspond to the ALU 113 of FIG. 1.

In some embodiments, input bits may be applied parallel or sequential to drains perform VMM layer by layer as discussed elsewhere in the present disclosure. For example, each horizontal layer, as illustrated in FIG. 5C, may be used to perform VMM by applying read voltage to the gates of devices in that layer and devices 105 in other horizontal layers that are not being used for VMM may shut off by applying the low voltage to the source line or the gate(s).

FIG. 5C illustrates an embodiment of the memory array 207 with the input signals being applied to the drains and the output signal being received via the sources of the devices 105. In other embodiments, the memory array 207 may be implemented with the input signals being applied to the gates or the sources of the devices 105 and the output signals may be received via the sources or the drains of the devices 105.

Modifications, additions, or omissions may be made to FIG. 5C without departing from the scope of the present disclosure. For example, the ALU 531 may include more or fewer elements than those illustrated and described in the present disclosure. Moreover, in some embodiments, the ALU 531 may include three or more input registers 110, ADCs 106, and/or registers 108.

Figure 5D:
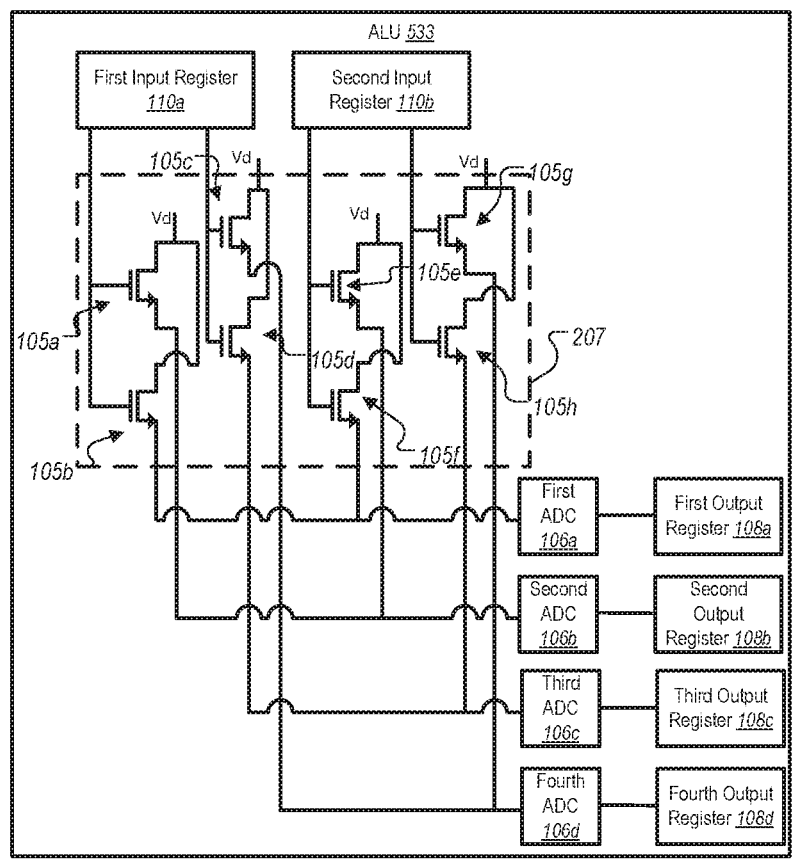
FIG. 5D illustrates an example ALU that may be implemented in the environment of FIG. 1, all in accordance with at least one embodiment described in the present disclosure.

FIG. 5D illustrates an example ALU 533 that may be implemented in the environment 100 of FIG. 1, in accordance with at least one embodiment described in the present disclosure. The ALU 531 may correspond to the ALU 113 of FIG. 1.

The input bits of the input vectors may be provided to the gates of the devices 105. In some embodiments, the source lines of the devices may be electrically coupled to the ADCs 106. In these and other embodiments, the bits lines may be provided a fixed voltage to bias the devices 105. In some embodiments, the bit lines and the source lines may be swapped. In these and other embodiments, the VMM may be implemented layer by layer. For example, as illustrated in FIG. 5C, the first VMM may be implemented in the first vertical layer along the y axis and the second VMM may be implemented in the second vertical layer along the y axis.

FIG. 5D illustrates an embodiment of the memory array 207 with the input signals being applied to the gates and the output signal being received via the sources of the devices 105. In other embodiments, the memory array 207 may be implemented with the input signals being applied to the drains or the sources of the devices 105 and the output signals may be received via the drains or the sources of the devices 105.

Modifications, additions, or omissions may be made to FIG. 5D without departing from the scope of the present disclosure. For example, the ALU 533 may include more or fewer elements than those illustrated and described in the present disclosure. Moreover, in some embodiments, the ALU 533 may include three or more input registers 110, ADCs 106, and/or registers 108.

Embodiments described in the present disclosure may be implemented using computer-readable media for carrying or having computer-executable instructions or data structures stored thereon. Such computer-readable media may be any available media that may be accessed by a general purpose or special purpose computer. By way of example, and not limitation, such computer-readable media may include non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by a general purpose or special purpose computer. Combinations of the above may also be included within the scope of computer-readable media.

Computer-executable instructions may include, for example, instructions and data, which cause a general-purpose computer, special purpose computer, or special purpose processing device (e.g., one or more processors) to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in the present disclosure, terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B." Further, use of the term "and/or" in the present disclosure does not change this interpretation of the use of the term "or" used elsewhere in the present disclosure.

All examples and conditional language recited in the present disclosure are intended for pedagogical objects to aid the reader in understanding the present disclosure and the concepts contributed by the inventor to furthering the art, and are to be construed as being without limitation to such specifically recited examples and conditions. Although embodiments of the present disclosure have been described in detail, various changes, substitutions, and alterations could be made hereto without departing from the spirit and scope of the present disclosure.

What is claimed is:

1. A system comprising:
   a memory array configured to be used for vector by matrix multiplication (VMM), the memory array comprising a matrix of devices, the memory array being configured to perform VMM layer by layer of the matrix of devices, each device of the matrix of devices being configured to:
      receive a sequence of programming signals or pulses to program a weight of the corresponding device to cause the memory array to store a matrix of weights;
      receive a digital input signal representative of a vector of input bits;
      generate an analog output signal by individually multiplying each input bit of the vector of input bits by the weight programmed on the corresponding device;
   a plurality of analog-to-digital converters (ADCs) electrically coupled to a corresponding device, each ADC of the plurality of ADCs being configured to convert a corresponding analog output signal to a digital output signal based on a current level of the corresponding analog output signal; and
   a plurality of registers electrically coupled to a corresponding ADC, each register of the plurality of registers being configured to shift and store an output vector of bits of a corresponding digital output signal based on an order of the vector of input bits received by the corresponding device.

2. The system of claim 1, wherein the memory array includes a flash memory array.

3. The system of claim 1, wherein the memory array includes a memristor memory array.

4. The system of claim 1, wherein the memory array includes a three-dimensional memory matrix.

5. The system of claim 1, wherein each device comprises a transistor that includes one or more gates, a drain, and a source.

6. The system of claim 5, wherein the memory array comprises a three-dimensional matrix of devices and each gate in a three-dimensional row is electrically coupled to each other via an electrical plane.

7. The system of claim 5, wherein the memory array comprises a two-dimensional matrix and each gate in a row are electrically coupled to each other.

8. The system of claim 5, wherein the memory array comprises a three-dimensional matrix of devices and each gate in a three-dimensional column is electrically coupled to each other via an electrical plane.

9. The system of claim 1, wherein the memory array is configured to be used for VMM for a neural network.

10. The system of claim 1, wherein two adjacent columns of devices are configured to receive input bits of adjacent significance.

11. The system of claim 1, wherein a resolution of sampling decreases by a bit for each input bit of the vector of input bits.

12. The system of claim 1, wherein a first input bit of the vector of input bits received by the corresponding device is a most significant bit.

13. The system of claim 1, wherein a temperature effect of the system is compensated by using a mirror circuit.

14. The system of claim 1, wherein a temperature effect of the system is compensated by using an ADC.

15. The system of claim 1, wherein the weights can be positive and negative.

16. The system of claim 1, wherein the memory array includes an input buffer that is smaller than a width of the vector of input bits.

17. The system of claim 1, wherein the memory array is configured to perform VMM for a first horizontal layer of devices and subsequently a second horizontal layer of devices.

18. The system of claim 1, wherein the memory array is configured to perform VMM for a first vertical layer of devices and subsequently a second vertical layer of devices.

19. A system comprising:
   a memory array configured to be used for vector by matrix multiplication (VMM), the memory array comprising a matrix of devices, each device of the matrix of devices being configured to:
      receive a sequence of programming signals or pulses to program a weight of the corresponding device to cause the memory array to store a matrix of weights;
      receive a digital input signal representative of a vector of input bits;
      generate an analog output signal by individually multiplying each input bit of the vector of input bits by the weight programmed on the corresponding device;
   a mirror circuit electrically coupled to a device, the mirror circuit being configured to bias the device based on a temperature of the system;
   a plurality of analog-to-digital converters (ADCs) electrically coupled to a corresponding device, each ADC of the plurality of ADCs being configured to convert a corresponding analog output signal to a digital output signal based on a current level of the corresponding analog output signal; and
   a plurality of registers electrically coupled to a corresponding ADC, each register of the plurality of registers being configured to shift and store an output vector of bits of a corresponding digital output signal based on an order of the vector of input bits received by the corresponding device, the shifting and storing of the output vector bits being performed at least partially at the same time as to the plurality of ADCs converting a subsequent corresponding analog output signal to a digital output signal.

* * * * *